United States Patent
Lee et al.

(10) Patent No.: US 11,116,074 B2
(45) Date of Patent: Sep. 7, 2021

(54) COLORED THIN COVERING FILM AND MANUFACTURING METHOD

(71) Applicant: ASIA ELECTRONIC MATERIAL CO., LTD., Hsinchu County (TW)

(72) Inventors: Wei-Chih Lee, Zhubei (TW); Li-Chih Yang, Zhubei (TW); Chien-Hui Lee, Zhubei (TW)

(73) Assignee: ASIA ELECTRONIC MATERIAL CO., LTD., Hsinchu County (TW)

( * ) Notice: Subject to any disclaimer, the term of this patent is extended or adjusted under 35 U.S.C. 154(b) by 295 days.

(21) Appl. No.: 15/841,448

(22) Filed: Dec. 14, 2017

(65) Prior Publication Data
US 2018/0249572 A1 Aug. 30, 2018

(30) Foreign Application Priority Data
Feb. 24, 2017 (CN) .......................... 201710102125.9

(51) Int. Cl.
*H05K 1/02* (2006.01)
*H05K 3/28* (2006.01)
(Continued)

(52) U.S. Cl.
CPC .............. *H05K 1/024* (2013.01); *H05K 3/28* (2013.01); *H05K 3/281* (2013.01); *B32B 27/08* (2013.01); *B32B 27/32* (2013.01); *B32B 2255/10* (2013.01); *B32B 2255/26* (2013.01); *B32B 2457/08* (2013.01); *H05K 1/0274* (2013.01); *H05K 2201/012* (2013.01); *H05K 2201/015* (2013.01); *H05K 2201/0145* (2013.01);
(Continued)

(58) Field of Classification Search
None
See application file for complete search history.

(56) References Cited

U.S. PATENT DOCUMENTS 6,379,799 B1 * 4/2002 Almen ............... C08G 59/3218
428/297.4
6,500,529 B1 * 12/2002 McCarthy .............. H05K 1/034
174/258
(Continued)

FOREIGN PATENT DOCUMENTS

JP 2004-214288 7/2004

OTHER PUBLICATIONS

TeflonTM Resins product literature from teflon.com (Year: 2021).*

Primary Examiner — Ramsey Zacharia
(74) Attorney, Agent, or Firm — Amin, Turocy & Watson, LLP

(57) ABSTRACT

A colored thin covering film is provided, including an upper detached layer, a colored ink film, a low dielectric glue layer, and a lower detached layer. The color ink layer is formed between the upper detached layer and the low dielectric glue layer. The low dielectric glue layer is formed between the colored ink layer and the lower detached layer. The thickness of the colored ink layer is between 1 to 10 μm, and the thickness of the low dielectric glue layer is between 3 to 25 μm, such that a total thickness of the colored ink layer and the low dielectric glue layer is allowed to be between 4 to 35 μm. The colored thin covering film has an extremely low dielectric constant and loss, extremely low ion migration, good adhesion, heat dissipation, high flexibility, and low resilience, and can be processed in a low temperature.

12 Claims, 1 Drawing Sheet

(51) Int. Cl.
*B32B 27/08* (2006.01)
*B32B 27/32* (2006.01)

(52) U.S. Cl.
CPC ............... *H05K 2201/0154* (2013.01); *H05K 2201/0175* (2013.01); *H05K 2201/0195* (2013.01); *H05K 2201/0761* (2013.01); *H05K 2203/066* (2013.01); *H05K 2203/161* (2013.01)

(56) References Cited

U.S. PATENT DOCUMENTS

| | | | | |
|---|---|---|---|---|
| 2007/0116964 | A1* | 5/2007 | Guo | B32B 7/12 |
| | | | | 428/414 |
| 2013/0338265 | A1* | 12/2013 | Masatomi | C08K 5/5419 |
| | | | | 523/456 |
| 2014/0370301 | A1* | 12/2014 | Sekito | C08G 18/4854 |
| | | | | 428/423.1 |
| 2017/0273179 | A1* | 9/2017 | Kim | B32B 15/09 |

\* cited by examiner

COLORED THIN COVERING FILM AND MANUFACTURING METHOD

TECHNICAL FIELD

The present disclosure relates to a covering film used in printed circuit boards, and especially to a colored thin covering film used in flexible printed circuit (FPC) boards and manufacturing method thereof.

BACKGROUND

Currently, the electronic system is developed towards being lighter in weight, thinner in thickness, shorter in length and smaller in size, with high thermal resistant, multi-functionality, high density, high reliability and low cost. In terms of function, a robust and high speed signal transmission is required. In the high frequency field, the wireless infrastructures need to provide sufficiently low insertion loss, lower dielectric constant and loss to improve the energy efficiency. With the increasing needs for the application of 5G era and USB3.1, radiofrequency products are required to provide wider bandwidth, and be compatible with the 3G and 4G business. Currently, the black polyimide thin film is a commonly used material of the commercially available covering film. Regarding the thinning design, the black polyimide thin film has a huge difficulty in forming a black polyimide having a thickness less than 5 μm, and the processing operability is not good. Also, the use of epoxy resin-based adhesives causes the problems of poor ion purity, poor electric property and high cost. All these problems make it hard for the covering film to catch up with the current trend of the ultra-thinning lines and high frequency, high speed transmission. In spite of another ink typed colored high frequency covering film, which is formed by coating colored ink on a yellow ultrathin polyimide film with a thickness of 5 to 7.5 μm, this method, however, has the problem of high cost and greater thickness.

Given the foregoing, the covering film is still in need of development and improvement, so as to meet the requirement for the design of fine wire circuits; the development in high thermal resistance, multiple functionality, high density, high reliability and low cost; and the functionality for robust and high speed signal transmission.

SUMMARY

The present disclosure provides a colored thin covering film, which may be prepared with a simple method, and has extremely low dielectric constant and loss, extremely low ion migration, good adhesion, high thermal dissipation, high flexibility, and low resilience. The cover film may be manufactured in a low temperature, and is particularly suitable for the current utilization in the high frequency, high speed and ultrathin circuit with a high density assembly having a line width/pitch less than 35/35 μm.

The present disclosure provides a colored thin covering film, including: an upper detached layer, a colored ink layer formed on the upper detached layer and having a thickness of from 1 μm to 10 μm, a low dielectric glue layer formed on the colored ink layer to sandwich the colored ink layer between the upper detached layer and the low dielectric glue layer, the low dielectric glue layer having a thickness of from 3 μm to 25 μm for a total thickness of the colored ink layer and the low dielectric glue layer to be from 4 μm to 35 μm, and a lower detached layer formed on the low dielectric glue layer to sandwich the low dielectric glue layer between the colored ink layer and the lower detached layer.

In one embodiment, the low dielectric glue layer has a Dk value of from 2.4 to 2.8 at 10 GHz, a Df value of from 0.002 to 0.006 at 10 GHz, a water absorption rate of from 0.05% to 0.2%, an insulation resistance between wires greater than $10^{11}\Omega$, a surface resistance greater than $10^{12}\Omega$, and a volume resistance greater than $10^{13}$ $\Omega\cdot cm$.

In one embodiment, the low dielectric glue layer is composed of at least one resin selected from the group consisting of a fluorine-based resin, an epoxy resin, an acrylic resin, an urethane resin, a silicon rubber resin, a poly-p-xylene resin, a bismaleimide-based resin, a polyimide resin, a polyamideimide resin, and a polyamide resin.

In one embodiment, the low dielectric glue layer includes sintered silicon dioxide, polytetrafluoroethylene, a fluorine-based resin excluded from polytetrafluoroethylene, a phosphorus-based flame retardant, and a polyimide resin, with a total content of the sintered silicon dioxide, the polytetrafluoroethylene, the fluorine-based resin excluded from polytetrafluoroethylene and the phosphorus-based flame retardant to be from 8 wt % to 50 wt % of the total solid content of the low dielectric glue layer. In one embodiment, the polyimide resin has a content from 40 wt % to 90 wt % of the total solid content of the low dielectric glue layer.

In one embodiment, the colored ink layer is composed of at least one resin selected from the group consisting of an epoxy resin, an acrylic resin, an urethane resin, a silicon rubber resin, a poly-p-xylene resin, a bismaleimide-based resin, a polyimide resin, a polyamideimide resin, and a polyamide resin.

In one embodiment, at least one of the upper detached layer and the lower detached layer is composed of at least one polymer independently selected from the group consisting of polypropylene, biaxially oriented polypropylene, and polyethylene terephthalate.

In one embodiment, the sintered silicon dioxide has a content from 2 wt % to 15 wt % of the total solid content of the low dielectric glue layer, the polytetrafluoroethylene has a content from 2 wt % to 10 wt % of the total solid content of the low dielectric glue layer, the fluorine-based resin excluded from polytetrafluoroethylene has a content from 2 wt % to 10 wt % of the total solid content of the low dielectric glue layer, the phosphorus-based flame retardant has a content from 2 wt % to 15 wt % of the total solid content of the low dielectric glue layer.

In one embodiment, the colored ink layer includes at least one of an inorganic pigment and an organic pigment, wherein the inorganic pigment is cadmium red, cadmium lemon yellow, cadmium yellow orange, titanium dioxide, carbon black, black iron oxide, or black complex inorganic pigment, and the organic pigment is aniline black, perylenen black, anthraquinone black, benzidine-based yellow pigment, phthalocyanine blue, or phthalocyanine green.

In one embodiment, the colored ink layer has a thickness of from 3 μm to 5 μm, and the low dielectric glue layer has a thickness of from 3 μm to 10 μm.

The present disclosure further provides a manufacturing method of the colored thin covering film of the present disclosure, including: coating a colored ink raw material on a lower surface of the upper detached layer; curing the colored ink raw material at a temperature of from 50° C. to 180° C. to form the colored ink layer; forming the low dielectric glue layer on a lower surface of the colored ink layer with a coating process or a transfer printing process; and adhering the lower detached layer on a lower surface of the low dielectric glue layer.

The colored thin covering film and manufacturing method thereof according to the present disclosure use a low dielectric glue layer having a Dk value of from 2.4 to 2.8 and a Df value of from 0.002 to 0.006. Owing to the lower ratio of the Dk/Df value, the loss during the signal transmission can be reduced, and the signal transmission quality can be further improved. Therefore, the present disclosure can fully meet the requirements for the development of the FPC with high frequency and high speed, rapid heat dissipation and conductivity, and the minimum production cost.

Further, the formulation of the low dielectric glue layer of the present disclosure contains the sintered silicon dioxide, polytetrafluoroethylene, fluorine-based resin excluded from polytetrafluoroethylene, phosphorus-based flame retardant and polyimide resin, thereby having a relative lower water absorption rate (from 0.05 to 0.2%), a stable performance after the water absorption, and better electrical properties. Also, the loss during signal transmission and insertion can be reduced.

Moreover, the low dielectric glue layer of the present disclosure has an extremely low Dk/Df value, and the value is stable in a high temperature and high moisture environment. Accordingly, the present disclosure is suitable for curing at a low temperature (lower than 190° C.), and has a high processability. Also, owing to less requirements for manufacturing equipment, the producing cost is further reduced.

In addition, the covering film of the present disclosure has a relative lower resilience, and is suitable for a downstream high density assembling process, and a total thickness of the colored ink layer and the low dielectric glue layer can be at least up to 4 to 7 μm, which meets the requirement for the design of FPC fine line circuit.

DETAILED DESCRIPTION OF EMBODIMENTS

Hereafter, the present disclosure will be described with reference to specific embodiments, such that a person skilled in the art can easily understand the advantages and effects of the present disclosure disclosed in the specification.

It should be noted that all of the structures, ratios, sizes and so on shown in the figures are used only for the purpose of illustrating the contents described in the specification, and for the understanding and reading of a person skilled in the art, rather than limiting conditions for implementing the present disclosure. Therefore, they do not have substantial meaning technically. Any modification of structure, alteration of proportional relation or adjustment of size, when not having the influence on effects and purposes of the present disclosure, should be deemed to fall within the scope contained in the technical contents of the present disclosure. Meanwhile, terms used herein such as "upper", "first", "second", "a", "an", and "the" are also only used for the clarity of the description, rather than limiting the scope of the present disclosure for the implementation. Thus, the alteration or adjustment on the relative relation, which does not substantially change the technical contents, should be deemed as falling within the scope of the present disclosure.

Figure 1:
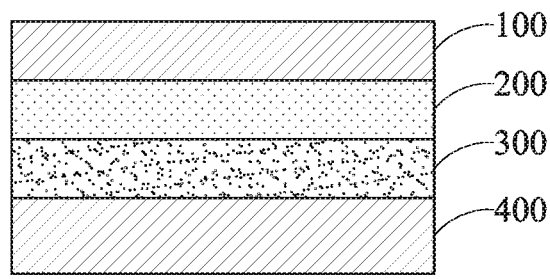
FIG. 1 is a schematic diagram showing the structure of single-layered colored ink layer.

As shown in FIG. 1, the present disclosure provides a colored thin covering film including an upper detached layer 100, a colored ink layer 200, a low dielectric glue layer 300, and a lower detached layer 400, wherein the colored ink layer 200 is formed between the upper detached layer 100 and the low dielectric glue layer 300, and the low dielectric glue layer 300 is formed between the colored ink layer 200 and the lower detached layer 400.

A total thickness of the colored ink layer 200 and the low dielectric glue layer 300 is 4 to 35 μm, wherein the colored ink layer 200 has a thickness of 1 to 10 μm, and the low dielectric glue layer 300 has a thickness of 3 to 25 μm.

In addition, the low dielectric glue layer 300 has a Dk value of 2.4 to 2.8 (10 GHz), a Df value of 0.002 to 0.006 (10 GHz), a water absorption rate of 0.05 to 0.2%, an insulation resistance between wires greater than $10^{11}\Omega$, a surface resistance greater than $10^{12}\Omega$, and a volume resistance greater than $10^{13}$ Ω·cm.

The material forming the low dielectric glue layer 300 includes at least one resin selected from the group consisting of fluorine-based resins, epoxy resins, acrylic resins, urethane resins, silicon rubber resins, poly-p-xylene resins, bismaleimide-based resins, polyimide resins, polyamideimide resins, and polyamide resins.

The extremely low dielectric glue layer 300 includes sintered silicon dioxide, polytetrafluoroethylene, a fluorine-based resin excluded from polytetrafluoroethylene, a phosphorus-based flame retardant, and a polyimide resin, wherein a total content of the sintered silicon dioxide, the polytetrafluoroethylene, the fluorine-based resin excluded from polytetrafluoroethylene and the phosphorus-based flame retardant is 8 to 50 wt % of the total solid content in the low dielectric glue layer, and a content of the polyimide resin is 40 to 90 wt % of the total solid content in the low dielectric glue layer.

The material forming the colored ink layer 200 includes at least one resin selected from the group consisting of epoxy resins, acrylic resins, urethane resins, silicon rubber resins, poly-p-xylene resins, bismaleimide-based resins, polyimide resins, polyamideimide resins and polyamide resins.

The upper detached layer 100 and the lower detached layer 400 are detached films or detached paper, and materials of the two include at least one polymer independently selected from the group consisting of polypropylene, biaxially oriented polypropylene, and polyethylene terephthalate.

A content of the sintered silicon dioxide is 2 to 15 wt % of the total solid content of the low dielectric glue layer, a content of the polytetrafluoroethylene is 2 to 10 wt % of the total solid content of the low dielectric glue layer, a content of the fluorine-based resin excluded from polytetrafluoroethylene is 2 to 10 wt % of the total solid content of the low dielectric glue layer, and a content of the phosphorus-based flame retardant is 2 to 15 wt % of the total solid content of the low dielectric glue layer.

The colored ink layer 200 includes an inorganic pigment or an organic pigment, wherein the inorganic pigment is cadmium red, cadmium lemon yellow, cadmium yellow orange, titanium dioxide, carbon black, black iron oxides, or black complex inorganic pigment; and the organic pigment is aniline black, perylene black, anthraquinone black, benzidine-based yellow pigment, phthalocyanine blue, or phthalocyanine green.

The colored ink layer is a red, yellow, black, white, blue or green ink layer.

If a matte surface of the colored ink layer is desired, an arbitrary combination of calcium sulfate, silicon dioxide, titanium dioxide, zinc sulfide, zirconium oxide, calcium carbonate and clay can be added into the ink layer for the purpose of extinction, thereby allowing the colored ink layer to be matte.

in Table 2 below, and they are compared with the current FPC boards in terms of property. Results thereof are listed in Table 2.

TABLE 2

|  | Thickness of the colored ink layer (μm) | Thickness of the low dielectric glue layer (μm) | Total thickness (μm) | Thermal conductivity coefficient K (W/mk) | Thermal conductivity efficiency R (° C./W) | Resistance to breakdown voltage (KV) | Dielectric constant Dk (10 GHz) | Dielectric loss Df (10 GHz) | Insulation resistance between wires (Ω/KV) |
|---|---|---|---|---|---|---|---|---|---|
| Ex. 1 | 3 | 3 | 6 | 0.436 | 0.021 | 0.8 | 2.78 | 0.005 | >$10^{11}$ |
| Ex. 2 | 3 | 5 | 8 | 0.392 | 0.032 | 1.0 | 2.70 | 0.005 | >$10^{11}$ |
| Ex. 3 | 5 | 10 | 15 | 0.411 | 0.057 | 1.8 | 2.61 | 0.004 | >$10^{11}$ |
| Ex. 4 | 5 | 20 | 25 | 0.358 | 0.108 | 2.5 | 2.50 | 0.004 | >$10^{11}$ |
| Comp. Ex. 1 | — | 25 | 25 | 0.300 | 0.129 | 3.4 | 2.40 | 0.003 | >$10^{11}$ |

The colored ink layer 200 has a thickness of 3 to 5 μm, the low dielectric glue layer 300 has a thickness of 3 to 10 μm. There is not a particular restriction on the thickness of the upper detached layer and the lower detached layer in the present disclosure.

The manufacturing method of the colored thin covering film of the present disclosure includes the following steps:

Step I: coating a colored ink raw material on a lower surface of the upper detached layer 100, and curing the colored ink raw material at 50° C. to 180° C. to form the colored ink layer 200; Step II: forming the low dielectric glue layer 300 on a lower surface of the colored ink layer 200 with a coating process or a transfer printing process; and Step III: adhering the lower detached layer 400 on a lower surface of the low dielectric glue layer 300.

Figure 2:
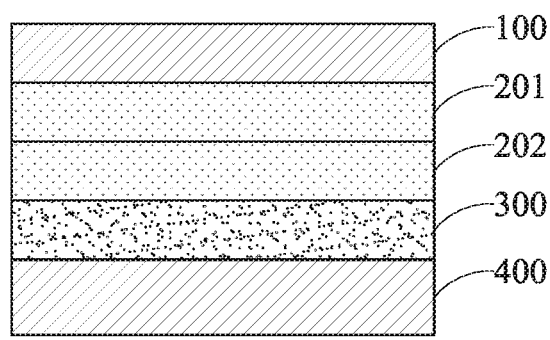
FIG. 2 is a schematic diagram showing the structure of double-layered colored ink layer.

As shown in FIG. 2, another embodiment of the colored thin covering film of the present disclosure, the colored thin covering film includes, in sequence, an upper detached layer 100, a first colored ink layer 201, a second colored ink layer 202, a low dielectric glue layer 300 and a lower detached layer 400, i.e., there are two or even more colored ink layers. In one embodiment, each of the first ink layer 201 and the second ink layer 202 has a thickness of 2 to 3 μm. The double-layered stacking structure of the first colored ink layer 201 and the second colored ink layer 202 facilitates to solve the problem of micropore during the coating procedure.

In a Table 1 below are specific weight percentages of the sintered silicon dioxide, the polytetrafluoroethylene, the fluorine-based resin excluded from polytetrafluoroethylene, the phosphorus-based flame retardant and the polyimide resin in the low dielectric glue layers of Examples 1-4 of the present disclosure.

TABLE 1

|  | Sintered silicon dioxide (%) | polytetra-fluoro-ethylene (%) | Fluorine-based excuded from polytetra-fluoro-ethylene (%) | Phosphorus-based flame retardant (%) | Polyimide resin (%) |
|---|---|---|---|---|---|
| Ex. 1 | 10 | 7 | 5 | 2 | 76 |
| Ex. 2 | 15 | 2 | 10 | 15 | 58 |
| Ex. 3 | 2 | 5 | 8 | 10 | 75 |
| Ex. 4 | 6 | 10 | 2 | 5 | 77 |

Specific stacking structures of the low dielectric glue layer and the colored ink layers of Examples 1-4 are listed Based on Table 2, the colored thin covering film has a higher thermal conductivity coefficient, lower thermal conductivity efficiency, lower resistance to breakdown voltage, and lower Dk/Df value.

The above examples are provided for the purpose of illustration only, and are not intended to limit the present invention. A person skilled in the art can modify and alter the above examples without departing from the spirits and scopes of the present invention. Thus, the scope claimed by the present invention should be as listed in the appended claims.

What is claimed is:

1. A colored thin covering film, comprising:
   an upper detached layer;
   a colored ink layer formed on the upper detached layer and having a thickness of from 1 μm to 10 μm;
   a low dielectric glue layer formed on the colored ink layer to sandwich the colored ink layer between the upper detached layer and the low dielectric glue layer, the low dielectric glue layer having a thickness of from 3 μm to 25 μm for a total thickness between the colored ink layer and the low dielectric glue layer to be from 4 μm to 35 μm; and
   a lower detached layer formed on the low dielectric glue layer to sandwich the low dielectric glue layer between the colored ink layer and the lower detached layer,
   wherein the low dielectric glue layer comprises sintered silicon dioxide, polytetrafluoroethylene, a fluorine-based resin excluded from polytetrafluoroethylene, a phosphorus-based flame retardant, and a polyimide resin, with a total content of the sintered silicon dioxide, the polytetrafluoroethylene, the fluorine-based resin excluded from polytetrafluoroethylene, and the phosphorus-based flame retardant to be from 8 wt % to 50 wt % of a total solid content of the low dielectric glue layer, and the polyimide resin has a content from 40 wt % to 90 wt % of the total solid content of the low dielectric glue layer,
   wherein the sintered silicon dioxide has a content from 2 wt % to 15 wt % of the total solid content of the low dielectric glue layer, the polytetrafluoroethylene has a content from 2 wt % to 10 wt % of the total solid content of the low dielectric glue layer, the fluorine-based resin excluded from polytetrafluoroethylene has a content from 2 wt % to 10 wt % of the total solid content of the low dielectric glue layer, and the phosphorus-based flame retardant has a content from 2 wt % to 15 wt % of the total solid content of the low dielectric glue layer.

2. The colored thin covering film of claim 1, wherein the low dielectric glue layer has a Dk value of from 2.4 to 2.8 at 10 GHz, and a Df value of from 0.002 to 0.006 at 10 GHz.

3. The colored thin covering film of claim 1, wherein the low dielectric glue layer has a water absorption rate of from 0.05% to 0.2%.

4. The colored thin covering film of claim 1, wherein the low dielectric glue layer has an insulation resistance between wires greater than $10^{11}\Omega$, a surface resistance greater than $10^{12}\Omega$, and a volume resistance greater than $10^{13}$ $\Omega \cdot$cm.

5. The colored thin covering film of claim 1, wherein the colored ink layer is composed of at least one resin selected from the group consisting of an epoxy resin, an acrylic resin, an urethane resin, a silicon rubber resin, a poly-p-xylene resin, a bismaleimide-based resin, a polyimide resin, a polyamideimide resin, and a polyamide resin.

6. The colored thin covering film of claim 1, wherein at least one of the upper detached layer and the lower detached layer is composed of at least one polymer independently selected from the group consisting of polypropylene, biaxially oriented polypropylene, and polyethylene terephthalate.

7. The colored thin covering film of claim 1, wherein the colored ink layer comprises at least one of an inorganic pigment and an organic pigment.

8. The colored thin covering film of claim 7, wherein the inorganic pigment is cadmium red, cadmium lemon yellow, cadmium yellow orange, titanium dioxide, carbon black, black iron oxide, or black complex inorganic pigment.

9. The colored thin covering film of claim 7, wherein the organic pigment is aniline black, perylene black, anthraquinone black, benzidine-based yellow pigment, phthalocyanine blue, or phthalocyanine green.

10. The colored thin covering film of claim 1, wherein the colored ink layer has a thickness of from 3 μm to 5 μm.

11. The colored thin covering film of claim 1, wherein the low dielectric glue layer has a thickness of from 3 μm to 10 μm.

12. A method for preparing the colored thin covering film of claim 1, comprising:
    coating a colored ink raw material on a lower surface of the upper detached layer;
    curing the colored ink raw material at a temperature of from 50° C. to 180° C. to form the colored ink layer;
    forming the low dielectric glue layer on a lower surface of the colored ink layer with a coating process or a transfer printing process; and
    adhering the lower detached layer on a lower surface of the low dielectric glue layer.

* * * * *